United States Patent [19]

Kim et al.

[11] Patent Number: 4,890,051
[45] Date of Patent: Dec. 26, 1989

[54] CMOS INPUT BUFFER STABLE FOR THE VARIATION OF A POWER SUPPLYING VOLTAGE

[75] Inventors: Byung-Youn Kim, Seoul; Yong-Bo Park, Busan; Tae-Sung Jung, Kyounggi-do, all of Rep. of Korea

[73] Assignee: Samsung Electronics Co., Ltd., Suwon City, Rep. of Korea

[21] Appl. No.: 289,731

[22] Filed: Dec. 27, 1988

[30] Foreign Application Priority Data

Dec. 20, 1988 [KR] Rep. of Korea ............ 198817051[U]

[51] Int. Cl.$^4$ .................................................. G05F 3/24
[52] U.S. Cl. ...................................... 323/313; 323/316; 323/317; 307/475; 307/585
[58] Field of Search ............... 323/313, 314, 315, 316, 323/317; 307/260, 261, 451, 475, 576, 585

[56] References Cited

U.S. PATENT DOCUMENTS

| | | |
|---|---|---|
| 4,453,121 | 6/1984 | Noufer ................................. 323/313 |
| 4,472,647 | 9/1984 | Allgood et al. ...................... 307/475 |
| 4,593,212 | 6/1986 | Svager ................................. 307/475 |
| 4,677,321 | 6/1987 | Bacrania ............................. 323/316 |
| 4,707,623 | 11/1987 | Bismarck ............................. 307/475 |
| 4,763,022 | 8/1988 | Sheldon ............................. 307/475 |

Primary Examiner—Peter S. Wong
Attorney, Agent, or Firm—Robert E. Bushnell

[57] ABSTRACT

A CMOS input buffer for converting the TTL level signals to the CMOS level signals, thereby being capable of stably operating within all allowable range of the power supply voltage, is disclosed. Said CMOS input buffer includes an inverter, a reference voltage generating circuit, a power supply voltage tracer circuit and an input circuit. The input circuit includes P-channel MOS transistors and N-channel MOS transistors so as to supply a stable logic output in response to the input signal of TTL level, regardless of variation of the power supply voltage Vcc, under the control of a voltage that is approximately proportional to the difference between the reference voltage and the power supply voltage within a fixed range of the power supply voltage.

14 Claims, 3 Drawing Sheets

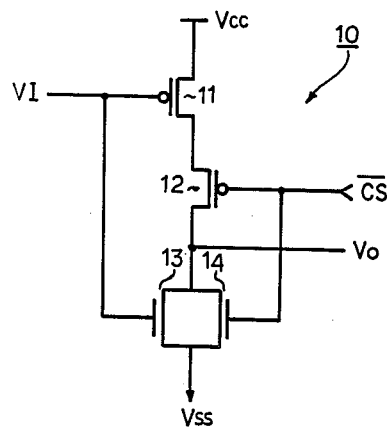
FIG. 1 (CONVENTIONAL CMOS)
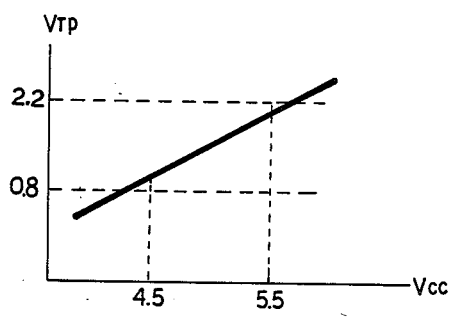
FIG. 2

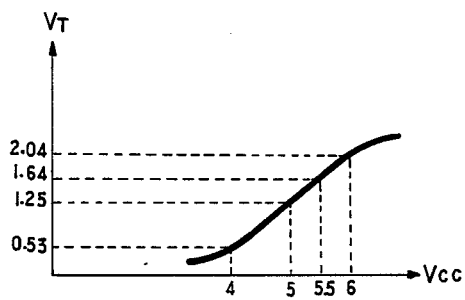
F I G. 4
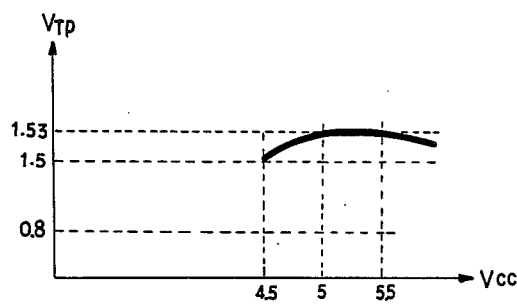
F I G. 5

CMOS INPUT BUFFER STABLE FOR THE VARIATION OF A POWER SUPPLYING VOLTAGE

BACKGROUND OF THE INVENTION

The present invention concerns a CMOS input buffer which stably operates for the variation of a power supply voltage.

When a CMOS integrated circuit is designed to receive TTL (transistor-transistor logic) level signals, its inputting stage is conventionally used as an input buffer which can convert the TTL level signals to the CMOS level signals. Typically, the CMOS input buffer converts the TTL level input signals such as address or data, to the CMOS level signals. The logic HIGH signal of the TTL level is defined between 2.2 volts and 5 volts, and the logic LOW signal thereof between 0 volt and 0.8 volt. Hence, the CMOS input buffer is in the worst case required to convert the TTL levels of 0.8 volt and 2.2 volt respectively to the logic LOW (ground voltage) and the logic HIGH (the power supply voltage Vcc). Conventionally, as the input buffer mainly is a NOR gate, it used NOR gate. It is preferable to maintain the trip point voltage of the NOR gate near the TTL mid-range voltage of 1.5 volt. However, the NOR gate has an inherent defect that the trip point voltage fluctuates according to variation of the power supply voltage Vcc. Consequently, the CMOS semiconductor memory allowing the variation of the power supply voltage to the range of 5 V±10% requires a CMOS input buffer capable of operating stably and surely within such a range of the variation.

SUMMARY OF THE INVENTION

It is, therefore, an object of the present invention to provide an improved CMOS input buffer capable of converting the TTL level signals to the CMOS level signals.

It is another object of the present invention to provide a CMOS input buffer capable of stably operating within a tolerance range of the power supply voltage.

The CMOS input buffer according to the present invention includes:

means for generating a constant reference voltage;

means for supplying a first voltage approximately proportional to the difference between said reference voltage and a power supply voltage within a fixed range of said power supply voltage;

a first P-channel MOS transistor for supplying a constant current upon variation of said power supply voltage, said first P-channel MOS transistor having a gate connected with said first voltage, a source connected with said power supply voltage, and a drain;

a second P-channel MOS transistor having a source connected with the drain of said first P-channel MOS transistor, a gate connected with an input signal, and a drain connected with an output terminal; and a first N-channel MOS transistor having a drain connected with the drain of said second P-channel MOS transistor, a gate connected with said input signal, and a source connected with a reference potential voltage.

BRIEF DESCRIPTION OF THE DRAWINGS

FIG. 1 illustrates the circuit of a conventional CMOS input buffer;

FIG. 2 is a graph for illustrating variation of the trip point voltage to variation of the power supply voltage in the conventional CMOS input buffer of FIG. 1;

FIG. 4 is a graph for illustrating variation of the tracer voltage to variation of the power supply voltage in FIG. 3; and FIG. 5 is a graph for illustrating variation of the trip point voltage in the output terminal of FIG. 3, to variation of the power supply voltage.

DETAILED DESCRIPTION OF THE PREFERRED EMBODIMENT

Figure 3:
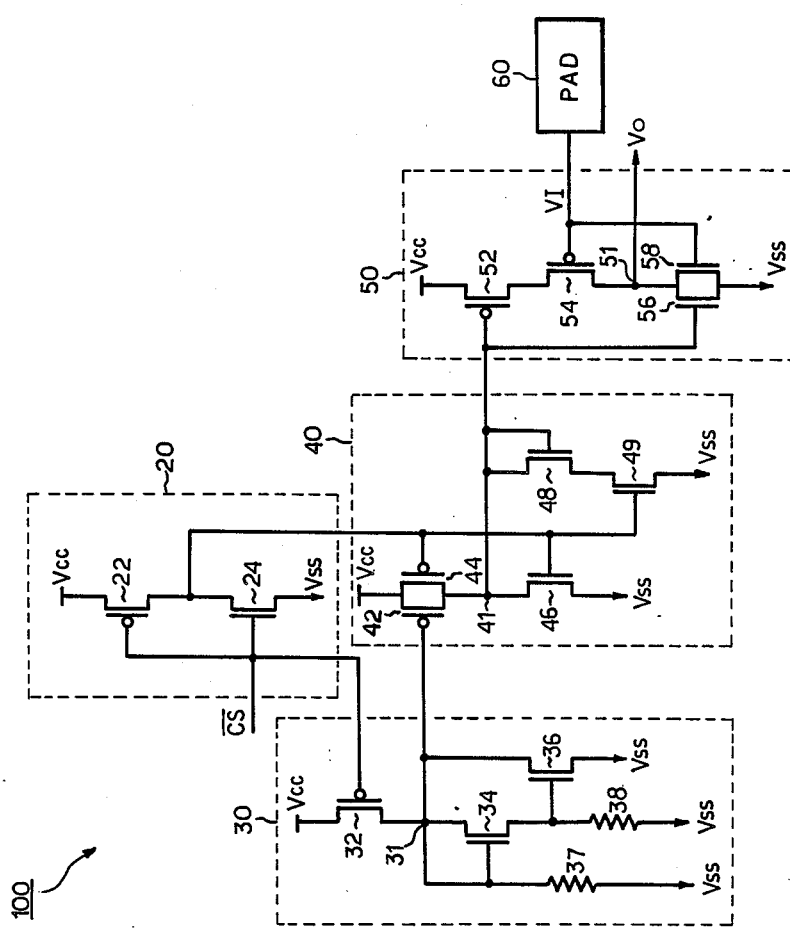
FIG. 3 is a circuit for illustrating an embodiment of the present invention.

The present invention will now be specifically described with reference to the drawings attached to the specification only by way of example.

Referring to FIG. 1, there is shown the CMOS input buffer of a conventional NOR gate. A CMOS input buffer 10 has P-channel MOS transistor 11 and N-channel MOS transistor 13 whose gates are connected with the input signal VI of TTL level. A chip selecting signal $\overline{CS}$ for enabling the input buffer 10 is connected with the gates of the P-channel MOS transistor 12 and the N-channel MOS transistor 14. The P-channel MOS transistor 11 has a drain connected with a power supply voltage Vcc. The N-channel MOS transistors 13 and 14 have drains connected with an output signal $V_O$ and drain of the P-channel MOS transistor 12, and the sources connected with the ground voltage Vss.

FIG. 2 is a graph for illustrating variation of the trip point voltage to variation of the power supply voltage in the enabled CMOS input buffer 10. As shown in the graph, the trip point voltage of the conventional CMOS input buffer 10 increases according to the increase of the power supply voltage Vcc. Consequently, the conventional CMOS input buffer 10 has been designed so as to place the trip point voltage VTP between the TTL LOW level of 0.8 V and the TTL HIGH level of 2.2 V, in the tolerance range of the power supply voltage, namely 4.5–5.5 V. However, this is very difficult to achieve due to the variation of the process. For example, if the trip point voltage VTP is made to be less than 0.8 volt at the power supply voltage of 4.5 volts, due to the process difference, and the input signal VI is 0.8 volt, then the output signal $V_O$ of the CMOS input buffer 10 will assume the logic LOW which is a false signal.

FIG. 3 illustrates the CMOS input buffer 100 of the present invention. The input buffer 100 includes an inverter 20, a reference voltage generating circuit 30, a power supply voltage tracer circuit 40 and an input circuit 50, wherein N-channel MOS transistors 24, 32–36, 46–49, and 54–58 all have the threshold voltage of 0.8 volt, while P-channel MOS transistors 22, 32, 42, 44, 52 and 54 all have the threshold voltage of about −0.8 volt.

The inverter 20 includes the P-channel MOS transistor 22 and the N-channel MOS transistor 24 whose gates receive the chip selecting control signal $\overline{CS}$ from the outside of the chip. The drain of the transistor 22 is connected with the power supply voltage Vcc, while the source of the transistor 24 is connected with the ground (the reference voltage Vss). The drains of the transistors 22 and 24 are commonly connected with each other to supply an inverted control signal CS.

The reference voltage generating circuit 30 includes the P-channel MOS transistor 32, the N-channel MOS transistors 34 and 36, and the resistors 37 and 38 so as to supply the reference voltage VR to the node 31 in response to the chip selecting control signal $\overline{CS}$. The transistors 32 has a gate connected with the chip selecting control signal $\overline{CS}$, the source connected with the power supply voltage Vcc, and the drain connected with the node 31. The drain and the gate of the N-channel MOS transistor 34 and one end of the resistor 37 and the drain of the N-channel MOS transistor 36 are all connected with the node 31. The source of the transistor 34 is connected with the gate of the transistor 36 and one end of the resistor 38. The other ends of the resistors 37 and 38 and the source of the transistor 36 are connected with the ground. The resistors 37 and 38 are made of polysilicon of 200–300 Giga-ohms in order to minimize the current consumption. Hence, the reference voltage VR of the node 31 is approximately the same as the sum of the threshold voltages of the transistors 34 and 36 when the transistor 32 is in conduction.

The power supply voltage tracer circuit 40 includes the P-channel MOS transistors 42 and 44, and the N-channel MOS transistors 46,48,49. The drains and sources of the transistors 42 and 44 are respectively connected with the power supply voltage Vcc and a tracer node 41. Also, the gates of the transistors 42 and 44 are respectively connected with the reference voltage VR and the inverted control signal CS. The drain of the transistor 46 and the drain and the gate of the transistor 48 are all connected with the node 41. The gate and the source of the transistor 46 are respectively connected with the inverted control signal CS and the ground, while the drain, the gate and the source of the transistor 49 are respectively connected with the source of the transistor 48, the inverted control signal CS and the ground. The power supply voltage tracer circuit 40 supplies the node 41 with the tracer voltage approximately proportional to the difference between the reference voltage and the power supply voltage Vcc at the logic HIGH state of the inverted control signal CS, within a fixed range of the power supply voltage Vcc, and charges the node 41 with the power supply voltage at the logic LOW state of the inverted control signal CS. It may be desirable that the size of the transistors 46 and 48 is designed to be much smaller than that of the transistor 42, and the channel length of the transistors 46 and 48 is made long enough to reduce the current discharge. In order to eliminate the abrupt peak voltage from the power supply, there is provided the transistors 48 and 49 which may be omitted.

The input circuit 50 includes P-channel MOS transistors 52 and 54 and N-channel MOS transistors 56 and 58 so as to supply a stable logic output in response to the input signal of TTL level under the control of the voltage of the node 41, regardless of variation of the power supply voltage Vcc. The transistor 52 has the gate connected with the node 41 and the source connected with the power supply voltage Vcc. The transistor 54 has a source connected with the drain of the transistor 52, a gate connected with the input signal VI of TTL level through the input pad 60 and a drain connected with the output node 51. The drains and the sources of the transistors 56 and 58 are respectively connected with the output node 51 and the ground. The gate of the transistor 56 is connected with the node 41, while the gate of the transistor 58 is connected with the input pad 60. The size of the transistor 56 is desirable to be designed to be smaller than that of the transistors 52 and 58.

Hereinafter, the operation of the inventive circuit will be explained with reference to FIG. 3.

When the chip selecting signal $\overline{CS}$ is in the logic HIGH, the reference voltage generating circuit 30 can not generate the reference voltage VR because of the nonconduction of the transistor 32. Also, by the inverted control signal CS through the inverter 20, the transistor 44 is in conduction, while the transistors 46 and 49 are in non-conduction. Hence, the voltage VT of the node 41 is charged by the power supplying voltage Vcc, thereby turning off the transistor 52 so that the input circuit 50 is disabled. If the chip selecting control signal $\overline{CS}$ becomes in logic LOW, the node 31 is maintained in the reference voltage VR of a constant value by the conduction of the transistor 32. The voltage VR is about 1.6 volt, which is the sum of the threshold voltages of the transistors 34 and 36. Simultaneously, by the inverted control signal CS the transistor 44 is turned OFF and the transistors 46 and 49 turned ON. The transistor 42 is turned ON at the power supply voltage Vcc being about 2.4 volts, which is a sum of the reference voltage VR and the threshold voltage of the transistor 42.

When the power supply voltage Vcc exceeds 2.4 volts, there increases the current flowing through the channel of the transistor 42. However, because the transistor 46 is in conduction, the initial current flowing through the transistor 42 is discharged through the transistor 46. If the power supply voltage Vcc increases more, the current flowing through the transistor 42 charges the tracer node 41 due to the small size of the transistor 46. The tracer voltage VT of the node 41 increases approximately linearly within the allowed range of the power supply voltage. Because the transistors 42 and 46 are saturated at the power supply voltage exceeding the maximum allowable range, the increase of the tracer voltage VT of the node 41 is slowed down. Therefore, the voltage VGS between the gate and the source of the transistor 52 of the input circuit 50 maintains almost a constant value for variation of the power supply voltage within the allowable range of the power supply voltage, and supplies a constant current.

If the level of the input signal VI is 0.8 volt at the maximum allowable voltage, the transistor 56 is made into conduction state by the increased tracer voltage VT. However, since the transistor 52 is larger than the transistor 56, and the voltage VGS between the gate and source of the transistor 52 by said voltage VT is much greater than that of the transistor 56, the transistor 52 conducts in a stronger degree more than the transistor 56, thereby the output signal $V_o$ makes the logic HIGH. On the other hand, when the input signal VI is about 2.2 volt, the transistor 58 of large size also conducts strongly, so that the output signal $V_0$ generates the logic LOW. If the input signal VI is 0.8 volt at the maximum allowable value of the power supply voltage, the transistor 54 strongly conducts, so that the output signal $V_0$ is in the logic HIGH. Also, if the input signal VI is 2.2 volt, the transistor 58 strongly conducts, so that the output signal $V_0$ is in the logic LOW. Therefore, the input circuit 50 can be designed so as to place the trip point voltage between 0.8 volt and 2.2 volt within the allowable range of the power supply voltage.

In designing the device according to a preferred embodiment of the present invention, the ratio of the width W of each transistor channel to the length L thereof is preferably indicated in the following table.

| REFERENCE NO. OF TRANSISTORS | W/L RATIO | REFERENCE NO. OF TRANSISTORS | W/L RATIO |
|---|---|---|---|
| 22 | 15/1.5 | 46 | 3/3 |
| 24 | 5/1.3 | 48 | 3/3 |
| 32 | 3/4 | 49 | 5/1.3 |
| 34 | 3/1.3 | 52 | 30/2 |
| 36 | 10/1.3 | 54 | 40/2 |
| 42 | 12/2 | 56 | 5/1.8 |
| 44 | 3/1.5 | 58 | 40/1.8 |

FIG. 4 is a graph for illustrating variation of the tracer voltage VT for variation of the power supply voltage Vcc according to the design values of the table, in the preferred embodiment. Further, FIG. 5 is a graph for illustrating variation of the trip point voltage VTP of the output circuit 50 within the ordinary allowable range of the power supply voltage.

As is apparent from the graph of FIG. 5, the trip point voltage VTP is established between the maximum TTL LOW level (0.8 volt) and the minimum TTL HIGH level (2.2 volt), within the allowable range of the power supply voltage. As described above, the trip point voltage of the input stage maintains a stable level for variation of the power supply voltage, according to the present invention, and therefore, the TTL logic input signal can be securely converted to the CMOS logic signal.

While the invention has been particularly shown and described with reference to a preferred embodiment, it will be understood by those skilled in the art that modifications in details may be made without departing from the spirit and scope of the invention.

What is claimed is:

1. A CMOS input buffer, comprising:
   means for generating a constant reference voltage;
   means for supplying a first voltage approximately proportional to the difference between said reference voltage and a power supply voltage within a fixed range of said power supply voltage;
   a first P-channel MOS transistor for supplying a constant current upon variation of said power supply voltage, said first P-channel MOS transistor having a gate connected with said first voltage, a source connected with said power supply voltage, and a drain;
   a second P-channel MOS transistor having a source connected with the drain of said first P-channel MOS transistor, a gate connected with an input signal, and a drain connected with an output terminal; and
   a first N-channel MOS transistor having a drain connected with the drain of said second P-channel MOS transistor, a gate connected with said input signal, and a source connected with a reference potential voltage.

2. The CMOS input buffer as claimed in claim 1, wherein said means for supplying the first voltage comprises a third P-channel MOS transistor having a gate connected with said reference voltage, a source connected with the power supply voltage and a drain connected with said first voltage, and a second N-channel MOS transistor having a drain connected with the drain of said third P-channel MOS transistor, a source connected with said reference potential voltage and a gate connected with a first control signal.

3. The CMOS input buffer as claimed in claim 2, further comprising a fourth P-channel MOS transistor having a source connected with said power supply voltage, a drain connected with said first voltage and a gate connected with said first control signal, for thereby turning off said first P-channel MOS transistor.

4. The CMOS input buffer as claimed in claim 3, wherein said means for generating the constant reference voltage comprises a fifth P-channel MOS transistor having a gate connected with an inverted signal of said first control signal, a drain connected with said reference voltage and a source connected with the power supply voltage.

5. The CMOS input buffer as claimed in claim 4, further comprising a third N-channel MOS transistor having a gate and a drain connected with said first voltage, and a source thereof, and a fourth N-channel MOS transistor having a drain connected with the source of said third N-channel MOS transistor, a gate connected with said first control signal and a source connected with said reference potential voltage.

6. The CMOS input buffer as claimed in claim 5, wherein said reference potential voltage corresponds to a ground level voltage.

7. A CMOS input buffer, comprising:
   means for generating a constant reference voltage;
   means for supplying a first voltage approximately proportional to the difference between said reference voltage and a power supply voltage within a fixed range of said power supply voltage;
   a first P-channel MOS transistor for supplying a constant current upon variation of said power supply voltage, said first P-channel MOS transistor having a gate connected with said first voltage, a source connected with said power supply voltage, and a drain;
   a second P-channel MOS transistor having a source connected with the drain of said first P-channel MOS transistor, a gate connected with an input signal, and a drain connected with an output terminal; and
   a first N-channel MOS transistor having a drain connected with the drain of said second P-channel MOS transistor, a gate connected with said input signal, and a source connected with a reference potential voltage;
   a second N-channel MOS transistor having a drain and a source connected respectively with the drain and the source of said first N-channel MOS transistor, and a gate connected with said first voltage.

8. The CMOS input buffer as claimed in claim 7, wherein the channel size of said second N-channel MOS transistor is smaller than that of said first and second P-channel MOS transistors, and said first N-channel MOS transistor.

9. The CMOS input buffer as claimed in claim 7, wherein said means for supplying the first voltage comprises a third P-channel MOS transistor having a gate connected with said reference voltage, a source connected with the power supply voltage and a drain connected with said first voltage, and a third N-channel MOS transistor having a drain connected with the drain of said third P-channel MOS transistor, a source connected with said reference potential voltage and a gate connected with a first control signal.

10. The CMOS input buffer as claimed in claim 9, further comprising a fourth P-channel MOS transistor having a source connected with said power supply voltage, a drain connected with said first voltage and a gate connected with said first control signal, for thereby turning off said first P-channel MOS transistor.

11. The CMOS input buffer as claim 10, wherein said means for generating the constant reference voltage comprises a fifth P-channel MOS transistor having a gate connected with an inverted signal of said first control signal, a drain connected with said reference voltage and a source connected with the power supply voltage.

12. The CMOS input buffer as claimed in claim 11, further comprising a fourth N-channel MOS transistor having a gate and a drain connected with said first voltage, and a source thereof, and a fifth N-channel MOS transistor having a drain connected with the source of said fourth N-channel MOS transistor, a gate connected with said first control signal and a source connected with said reference potential voltage.

13. The CMOS input buffer as claimed in claim 12, wherein said reference potential voltage corresponds to a ground level voltage.

14. An input buffer, comprising:
means for generating a constant reference voltage;
means for supplying a first voltage approximately proportional to the difference between said reference voltage and a power supply voltage within a fixed range of said power supply voltage;
a first of a first conductivity-type transistor for supplying a constant current upon variation of said power supply voltage, said first of said first conductivity-type transistor having a control electrode connected with said first voltage, a first conduction electrode connected with said power supply voltage, and a second conduction electrode;
a second of said first conductivity-type transistor having a first conduction electrode connected with the second conduction electrode of said first of said first conductivity-type transistor, a control electrode connected with an input signal, and a second conduction electrode connected with an output terminal; and
a first of a said second conductivity-type transistor having a first conduction electrode connected with the second conduction electrode of said second of said first conductivity-type transistor, a control electrode connected with said input signal, and a second conduction electrode connected with a reference potential.

* * * * *